United States Patent [19]

Mercier et al.

[11] Patent Number: 5,406,197

[45] Date of Patent: Apr. 11, 1995

[54] APPARATUS FOR CONTROLLING TEST INPUTS OF CIRCUITS ON AN ELECTRONIC MODULE

[75] Inventors: Stephen J. Mercier, Apalachin; Everett G. Vail, III, Binghamton, both of N.Y.

[73] Assignee: International Business Machines Corporation, Armonk, N.Y.

[21] Appl. No.: 923,307

[22] Filed: Jul. 31, 1992

[51] Int. Cl.[6] .......................................... G01R 31/28
[52] U.S. Cl. ................................. 324/158.1; 324/73.1
[58] Field of Search ................ 324/73.1, 158 R, 500, 324/537, 750, 158.1, 754, 765; 371/22.1, 22.3, 25, 15.1

[56] References Cited

U.S. PATENT DOCUMENTS

| | | | |
|---|---|---|---|
| 3,789,205 | 1/1974 | James | 371/22.1 |
| 4,743,841 | 5/1985 | Takeuchi | 324/158 R |
| 5,012,185 | 4/1991 | Ohfuji | 371/22.6 |
| 5,032,789 | 7/1991 | Firooz et al. | 324/158 R |
| 5,101,151 | 3/1992 | Beaufils et al. | 324/158 R |
| 5,124,636 | 6/1992 | Pincus et al. | 324/73.1 |
| 5,126,953 | 6/1992 | Berger et al. | 324/73.1 |
| 5,131,272 | 7/1992 | Ménei et al. | 324/73.1 |
| 5,132,635 | 7/1992 | Kennedy | 324/158 R |

*Primary Examiner*—Vinh Nguyen
*Attorney, Agent, or Firm*—Baker, Maxham, Jester & Meador

[57] ABSTRACT

A circuit reduces the cost of electronic systems that contain integrated circuit chips with test leads by reducing the number of off-module connections required to drive these test leads in the assembled system. Instead of driving each such test lead through an intermodule interconnector, a single MODULE TEST line coming in through the intermodule interconnector is input to a circuit that then drives all chip test leads to an appropriate state in the assembled system, while leaving those test leads in a high-impedance state during test, allowing a module tester to drive them as required by its test program.

6 Claims, 5 Drawing Sheets

APPARATUS FOR CONTROLLING TEST INPUTS OF CIRCUITS ON AN ELECTRONIC MODULE

BACKGROUND OF THE INVENTION

1. Field of the Invention

This invention relates to methods for testing digital systems composed of multiple modules, e.g. printed circuit boards, each containing a number of integrated circuit chips, and more specifically to systems where some or all integrated circuit chips have leads used only during testing.

2. Discussion of the Related Art

One recurring challenge in the design and manufacture of electronic systems is control and reduction of the size of the physical interfaces between modularized elements. Such elements include, for example, integrated circuits and circuit boards. The physical interface of a modularized element is usually presented in the form of connector hardware. In integrated circuits the physical interface is presented in the form of leads; in modules, in the form of pins or pads.

It is common for test purposes to add special leads to integrated circuit chips. A widely-used example of such a test lead is an INHIBIT input lead. Whenever such a lead is driven to logic 1, circuitry inside the chip sets all the output and input/output leads of the chip to a high-impedance state. A chip's INHIBIT lead would typically be driven to logic 1 by module-level testers in order to isolate different chips within one module. The use of a lead similar to an INHIBIT lead is disclosed, for example, in U.S. Pat. No. 3,789,205 issued to R. L. James. The James patent teaches the testing of MOSFET chips which use wired-OR rather than high impedance outputs. See also U.S. Pat. No. 5,012,185 of K. Ohfuji where each chip is provided with two test input leads, allowing outputs to be switched between normal output, logic 0, logic 1 and high impedance states during test.

When a digital system containing chips with INHIBIT leads is finally shipped to customers, signal lines connected to INHIBIT leads must be permanently tied to logic 0 by wiring external to the module. Such wiring may be expensive, particularly if there are many chips on the module, each having its own INHIBIT lead and corresponding signal line. A need is thus felt in the art for a method for using INHIBIT leads and similar test leads for module testing without having to wire all INHIBIT lines external to the module.

SUMMARY OF THE INVENTION

Accordingly, it is an object of this invention to reduce the cost of tying INHIBIT leads and similar test leads to logic 0 by reducing the required amount of wiring external to the module.

This invention is practiced on one or more modules, each of which includes a multi-pin intermodule connection providing a physical interface for conducting signals to and from the modules. The invention selects one of the chips on the module having some extra room and extra leads. One of those extra leads, called MODULE TEST, is connected to the intermodule connector. Other extra leads are connected to the INHIBIT inputs of other chips. Logic inside the designated chip ensures that when MODULE TEST is at logic 1, the designated chip presents a high impedance to the INHIBIT inputs of the other chips; whereas when MODULE TEST is at logic 0, the designated chip drives the INHIBIT inputs of the other chips to logic 0. With this additional circuitry, the module tester can drive the INHIBIT inputs as desired if it also drives MODULE TEST to logic 1, while in the shipped product those inputs are all tied to logic 0 provided only that the single intermodule line MODULE TEST is driven to logic 0 by logic external to the module. This eliminates the need to connect each of the circuit INHIBIT lines to a respective pin of the intermodule connector.

BRIEF DESCRIPTION OF THE DRAWINGS

For a more complete understanding of this invention, reference is now made to the following detailed description of the embodiments illustrated in the accompanying drawing, wherein.

DETAILED DESCRIPTION OF THE PREFERRED EMBODIMENTS

Figure 1:
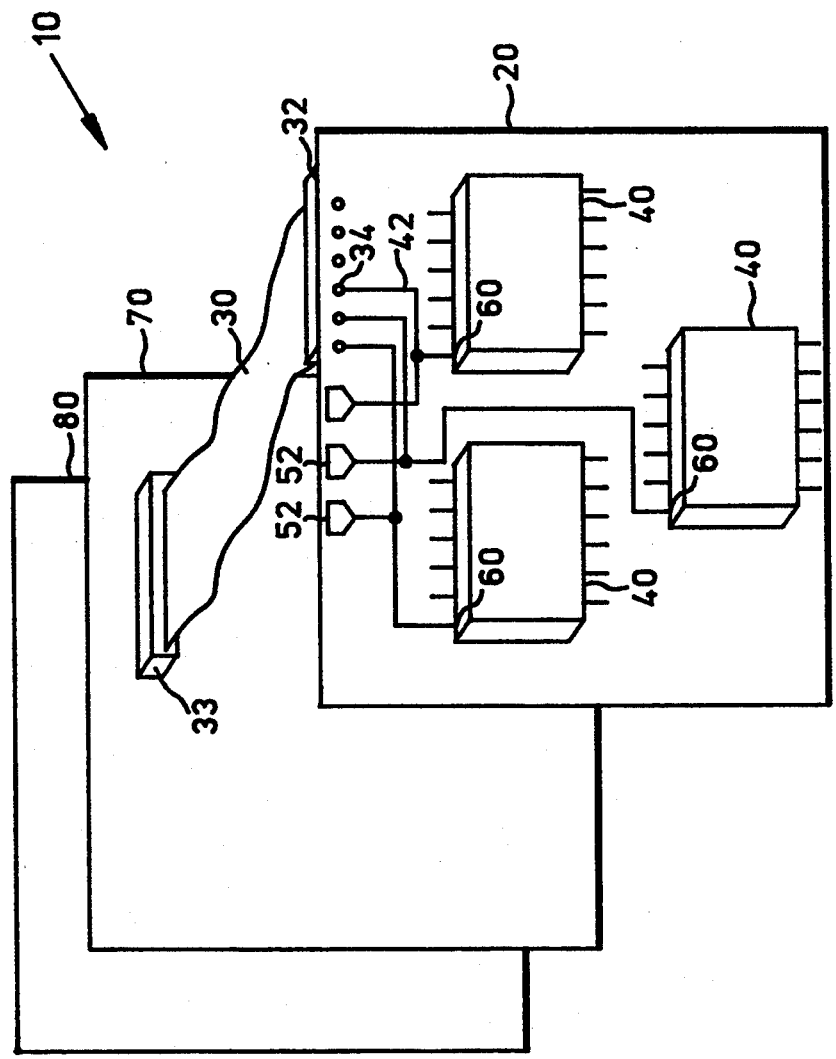
FIG. 1 shows a digital system comprising modules with chips having test leads as known in the art.

FIG. 1 (prior art) shows a digital system 10 comprising a number of modules 20, 70, 80. The module 20 has a multi-pin intermodule connector 32 which joins it via a cable 30 to other modules 70, 80. The connector 32 has a limited number of connection points 34.

The module 20 contains a number of integrated circuit chips 40. Each chip 40 has an INHIBIT lead 60, which must be driven to logic 0 from outside the module and thus must be joined by a line 42 to a connection point 34 on an intermodule connector 32. If there are a number of chips 40 on module 20, it is seen that a similar number 34 of connection points on intermodule connector 32 are taken up, reducing the number available for other purposes. The INHIBIT lines 42 are also brought out to module pins 52 so that they can be driven by test equipment (not shown) during module test.

In some test situations the test equipment may be able to drive the INHIBIT lines 42 through the connector 32, making the pins 52 unnecessary. Likewise the function of the cable 30 may be accomplished instead by a backplane or other form of interconnection.

Figure 2:
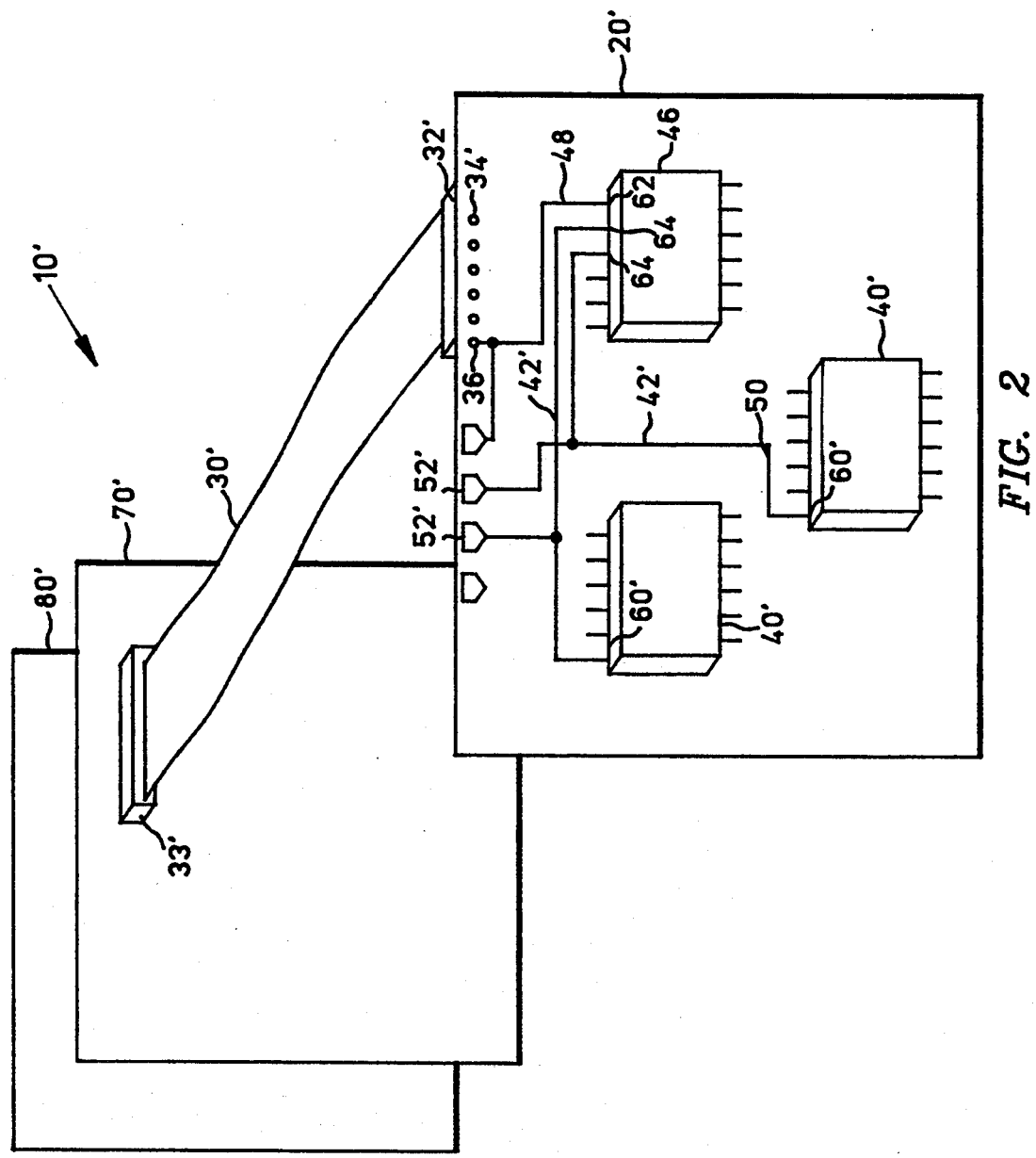
FIG. 2 shows a digital system of the same kind illustrated in FIG. 1, but arranged in accordance with this invention to reduce intermodule wiring.

FIG. 2 shows a digital system 10' arranged in accordance with this invention. The digital system 10' includes a plurality of electronic modules 20', 70' and 80'. Features of the module 20' are illustrated in FIG. 2, it being understood that similar features are also found on the modules 70' and 80'. The module 20' can comprise a conventional multi-layer interconnection board (MIB) on which a plurality of multi-lead integrated circuit chips 40' are mounted. Each of the chips 40' has an INHIBIT lead 60'. Each INHIBIT lead 60' is connected by a signal line 42' to a test equipment module pad 52'. The module 20' is connected to other modules of the system 10' by intermodule connectors. One such intermodule connector is indicated by reference numeral 32' and connects the module 20' to a similar intermodule connector 33' on the module 70' through a cable 30'.

The pins (not shown) of the intermodule connector 32' are connected to signal lines of the module 20' through pads 34'. None of the INHIBIT signal lines 42' is connected to the intermodule connector 32'.

The module 20' also has mounted on it a designated chip 46. The chip 46 has one lead 62 connected by a signal line 48 to a connection pad on intermodule connector 32'. The chip 46 also has a number of output leads 64, each connected by a signal line 42' to a respective INHIBIT lead 60' of one other chip 40' and to a test pad 52'.

During module test, the test pads 52' allow signal lines 42' and INHIBIT leads 60' to be driven by test equipment (not shown). When the system 10' is finally assembled and shipped, a signal source outside the module 20' drives line 48 through intermodule connector 32' to logic 0, in response to which the designated chip 46 drives signal lines 42' and thus INHIBIT leads 60' to logic 0. This eliminates the need for a signal source outside module 20' to drive INHIBIT leads 60' through a corresponding number of intermodule pins as in FIG. 1.

Figure 3:
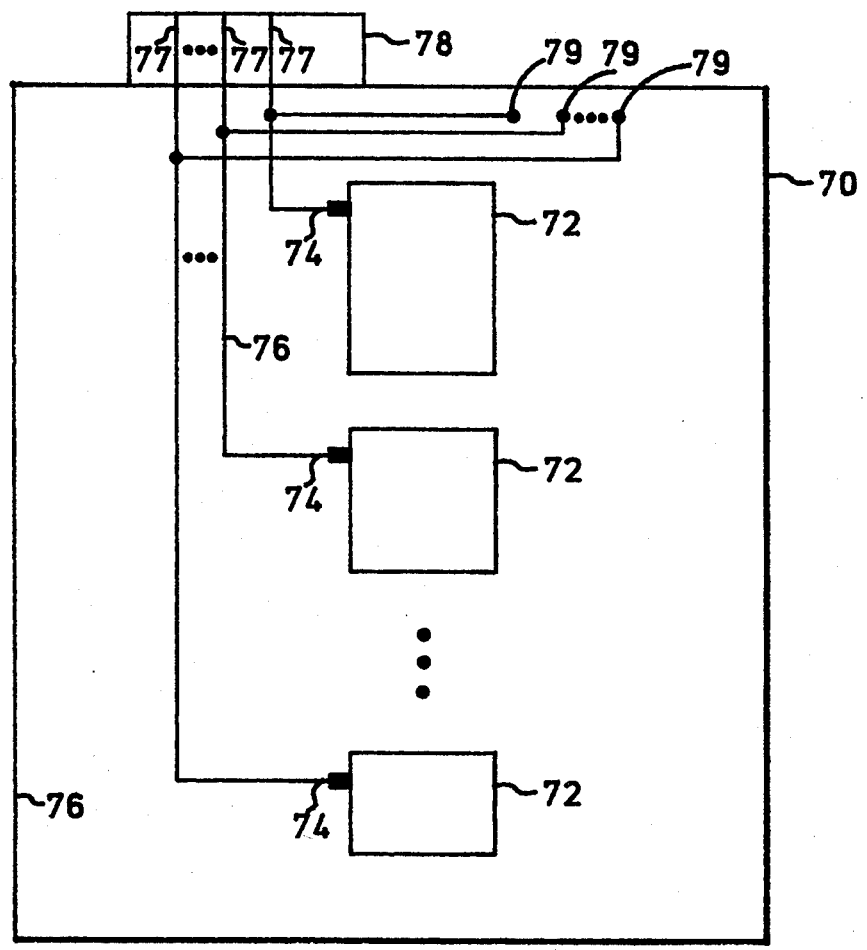
FIG. 3 is an electrical schematic of a digital system with test leads as known in the art.

FIG. 3 is an electrical schematic of a module 70 whose chips 72 have INHIBIT leads 74 as known in the art. It is seen that each inhibit lead 74 requires an interconnect line 76 to be connected off the module through a corresponding pin in an intermodule connector 78. Each INHIBIT lead is also connected to a respective test pad 79.

Figure 4:
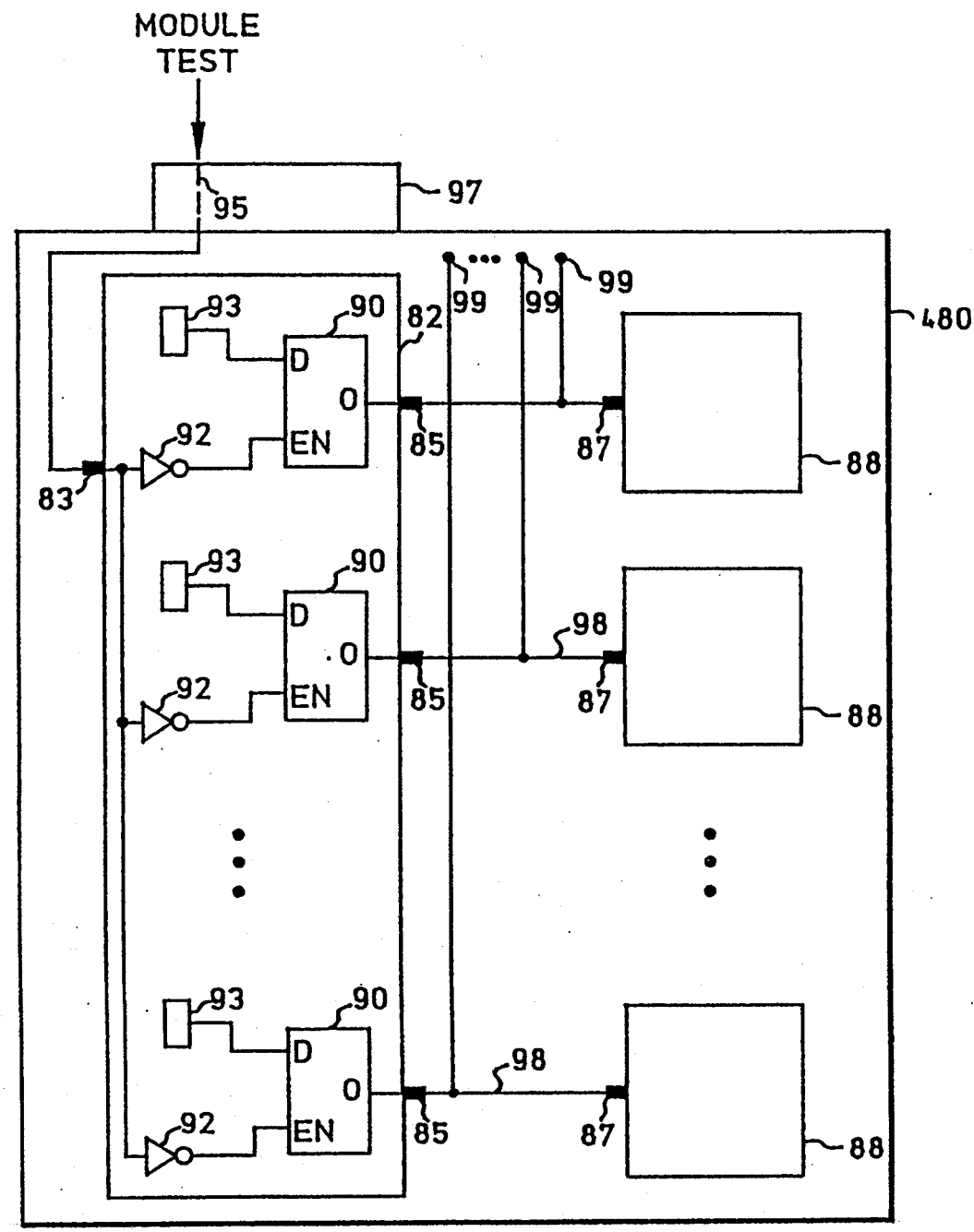
FIG. 4 is an electrical schematic of a digital system with test leads arranged in accordance with this invention to reduce intermodule wiring.

FIG. 4 is an electrical schematic of a module 480 designed in accordance with this invention. A designated chip 82 on the module contains an additional input lead 83, called MODULE TEST, and one additional output lead 85 for each INHIBIT lead 87 on other chips 88.

The designated chip 82 contains a set of circuits for controlling the INHIBIT leads when the module is assembled with other modules and operated in an electronics system. Each circuit of the set of circuits includes a driver 90 having an output connected to a respective output lead 85, an enable input (EN) and a data input (D). Each enable input is connected to the output of an inverter 92. The inputs of all the inverters 92 are connected in common to the input lead 83. Each driver has its data input connected to an internal tie 93 to logic 0.

The input lead 83 receives a MODULE TEST signal by way of a pin 95 in an intermodule connector 97. When MODULE TEST is driven to a logic 0 state, each driver 90 is enabled and outputs a logic 0 state signal. When MODULE TEST is driven to logic 1, each driver is disabled and presents a high-impedance state through its output.

Each of the output leads 85 on the designated chip 46 is connected to a line 98 on the module support member; each line also connects to the INHIBIT lead 87 of a respective chip 88 and to a respective module test equipment pad 99.

When such a module 480 is being tested by a module-level tester (not shown), the tester drives MODULE TEST to logic 1. This causes the designated chip 82 to put output leads 85 into a high-impedance state. The module-level tester then drives INHIBIT input leads 87 of the different chips 88 to logic 1 or 0 as required by its test program through pads 99.

When such a module is finally assembled and shipped as part of a system, wiring external to the module 480 ties the single MODULE TEST pin 95 in the intermodule connector 97 to system logic 0. As a consequence, the designated chip 82 drives all the output leads 85 to logic 0, and thus the INHIBIT input leads 87 on all chips having them are at logic 0, as is desired during system operation.

The designated chip 82 does not need to be a special chip added to the module 480 for this purpose. Rather it may be any chip in the module that has some extra leads 85 and extra capacity for the small amount of additional circuitry required by this invention. Likewise, even if no single chip has enough extra leads and capacity to implement the invention, the needed circuitry may be spread out among a limited number of chips, each having a MODULE TEST input lead tied to a single MODULE TEST pin in an intermodule connector and output leads connected to respective INHIBIT inputs of certain other chips.

Figure 5:
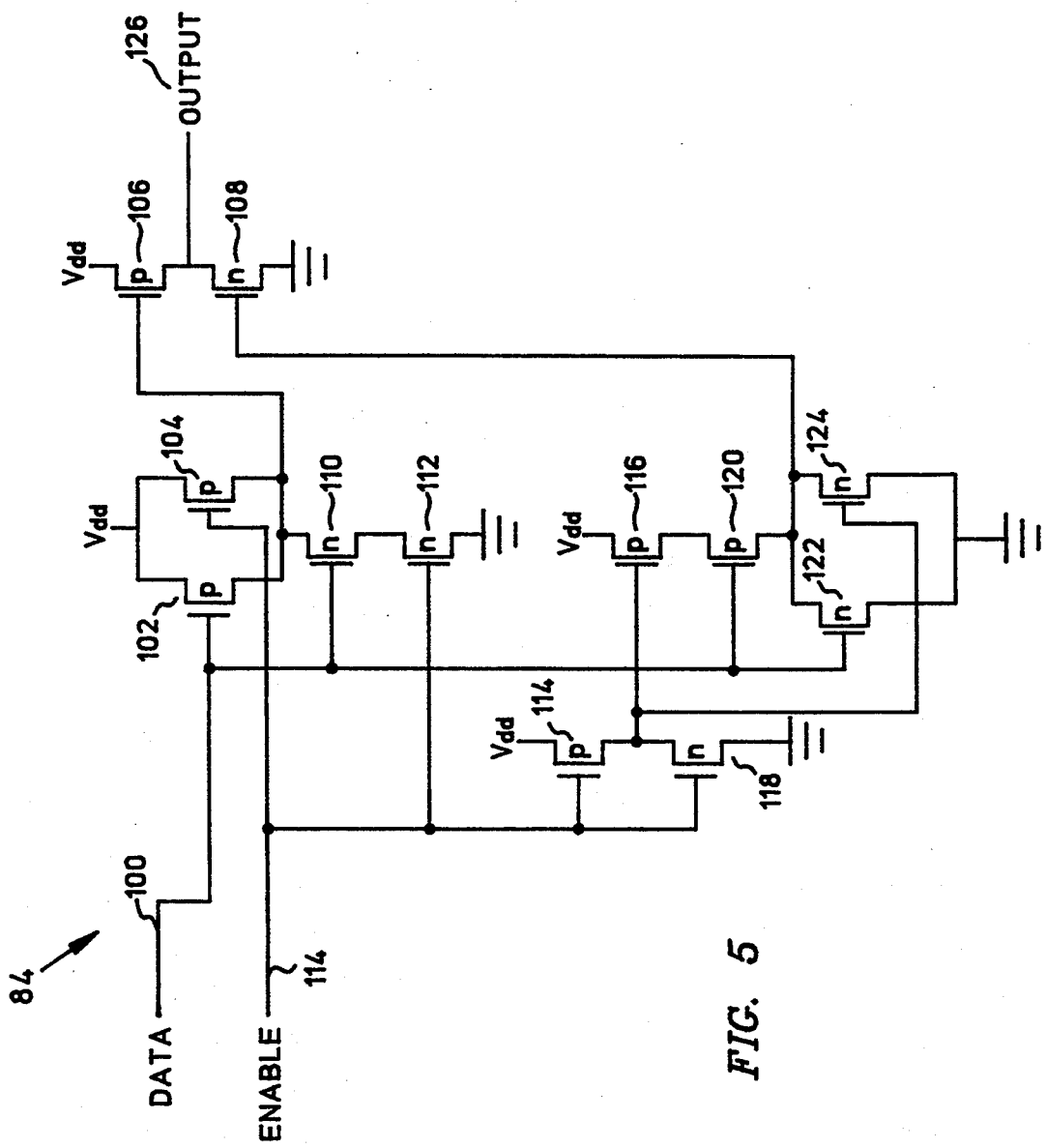
FIG. 5 is an electrical schematic of a tri-state driver used in this invention.

FIG. 5 shows the detailed design of a tri-state driver in a CMOS technology. Such a driver may be used in the chip 82, assuming use of a CMOS technology. When used in this invention, driver 84's data input 100 is tied low by a tie 93. Under those circumstances, a PMOS transistor 120 becomes a short circuit and an NMOS transistor 122 an open circuit. Thus, the transistors 116 and 124 become a CMOS inverter whose input is the output of the CMOS inverter formed by transistors 114 and 118, whose input in turn is ENABLE signal 114.

Furthermore, because the data input 100 is tied low, the PMOS transistor 102 becomes a short circuit and the NMOS transistor 110 an open circuit, so the gate of the transistor 106 is tied to Vdd and thus the transistor 106 is an open circuit. As just discussed, the gate of the NMOS transistor 108 is being driven by the ENABLE input buffered through two CMOS inverters. Thus, it is seen that when the ENABLE input is high, transistor 108 drives output line 126 to ground, whereas when the ENABLE input is low, the transistor 108 becomes an open circuit and the output line 126 presents a high impedance.

Obviously, other embodiments and modifications of this invention will occur readily to those of ordinary skill in the art in view of these teachings. Therefore, the invention is to be limited only by the following claims, which include all such obvious embodiments and modifications when viewed in conjunction with the above specification and accompanying drawing.

We claim:

1. In an electronic module, including:
    a module support member;
    a plurality of integrated circuits mounted on the module support member, each integrated circuit including a test inhibit input means for receiving a test inhibit signal; and
    an intermodule connector mounted on the module support member;
  a combination on the module support member for controlling testing of the integrated circuits, the combination comprising:
    a plurality of circuit test signal input lines on the module support member, each circuit test signal input line connected to a respective test inhibit input means, each circuit test signal input line for conducting a test signal to the test inhibit input means to which it is connected;
    a single module test control input line on the module support member;

the module test control input line connected to a single intermodule connection pin in the intermodule connector for receiving a module test control signal;

in a single integrated circuit of the plurality of integrated circuits, a plurality of driver circuit means, each driver circuit means having a first input connected to the module test control input line, and an output connected to a respective circuit test input line, each driver circuit means for:

placing a predetermined signal on the respective circuit test signal input line to which it is connected in response to a first state of the module test control signal, thereby preventing a test signal from being placed on the respective circuit test signal input line; and presenting a high impedance to the respective circuit test input line to which it is connected in response to a second state of the module test control signal, thereby permitting a test signal to be placed on the respective circuit test signal input line.

2. The combination of claim 1, further including a plurality of module test connection pads not connected to the intermodule connector, each module test connection pad connected to a respective circuit test signal input line for coupling a test signal to the respective circuit test signal input line.

3. The combination of claim 1, wherein each driver circuit means includes a CMOS driver having a drive input connected to a predetermined logic level, an enable input connected to the module test control input line, and an output connected to a respective circuit test input line.

4. An apparatus for testing an electronic module, comprising:

a module support member;

a plurality of circuit chips on the module support member, each circuit chip including a test INHIBIT input pin;

an intermodule connector mounted on the module member for conducting intermodule signals to and from the electronic module;

a plurality of test equipment pads on the module support member for applying test signals to the module support member;

a plurality of test configuration signal input lines, each test configuration signal input line connected to a respective test equipment pad and to a respective test INHIBIT input pin, but not connected to the intermodule connector;

a single module test control input line connected to the intermodule connector;

the module test control input line connected to a single intermodule connection pin in the intermodule connector for receiving a module test control signal through the intermodule connector;

a plurality of driver circuit means in the plurality of circuit chips, each driver circuit means having a first circuit input connected to the module test control input line, and a circuit output connected to a respective test configuration signal input line, each driver circuit means for:

coupling an INHIBIT signal to the respective test configuration signal input line to which it is connected in response to the module test control signal, thereby inhibiting application of a test configuration signal to the respective test configuration signal input line; and presenting a high impedance to the respective test configuration input line to which it is connected in response to absence of the module test control signal, thereby permitting a test configuration signal to be placed on the respective test configuration input line.

5. The apparatus of claim 4, wherein the plurality of driver circuit means is contained in a single circuit chip of the plurality of circuit chips, the single circuit chip including:

a plurality of signal leads;

a single input signal lead in the plurality of signal leads being connected to all first inputs of the set of driver circuit means; and the single input signal lead being connected to the module test control input line.

6. The apparatus of claim 4 or claim 5, wherein each driver circuit means includes CMOS driver having a drive input connected to a predetermined logic INHIBIT level, and enabling an input connected to the module test control input line, and an output connected to a respective test configuration input line.

* * * * *

UNITED STATES PATENT AND TRADEMARK OFFICE
CERTIFICATE OF CORRECTION

PATENT NO. :   5,406,197
DATED       :   April 11, 1995
INVENTOR(S) :  Mercier et al It is certified that error appears in the above-indentified patent and that said Letters Patent is hereby corrected as shown below:

Column 5, line 41, insert --support-- following "module".

Signed and Sealed this

Twenty-fifth Day of July, 1995

Attest:

BRUCE LEHMAN

*Attesting Officer*        *Commissioner of Patents and Trademarks*